United States Patent
Saumer

(10) Patent No.: US 10,622,773 B2
(45) Date of Patent: Apr. 14, 2020

(54) SAFETY SWITCHING APPARATUS FOR THE SECURE SWITCHING OFF AND/OR ON OF AT LEAST ONE ELECTRICAL MACHINE

(71) Applicant: SICK AG, Waldkirch (DE)

(72) Inventor: Markus Saumer, Waldkirch (DE)

(73) Assignee: SICK AG, Waldkirch (DE)

( * ) Notice: Subject to any disclaimer, the term of this patent is extended or adjusted under 35 U.S.C. 154(b) by 0 days.

(21) Appl. No.: 16/041,256

(22) Filed: Jul. 20, 2018

(65) Prior Publication Data

US 2019/0052037 A1 Feb. 14, 2019

(30) Foreign Application Priority Data

Aug. 11, 2017 (EP) .................................... 17185994

(51) Int. Cl.
| | |
|---|---|
| *H01R 12/00* | (2006.01) |
| *H01R 31/06* | (2006.01) |
| *H01H 1/40* | (2006.01) |
| *H01R 12/72* | (2011.01) |
| *H01R 13/40* | (2006.01) |
| *H01R 13/516* | (2006.01) |

(Continued)

(52) U.S. Cl.
CPC ............. *H01R 31/06* (2013.01); *H01H 1/403* (2013.01); *H01R 12/721* (2013.01); *H01R 13/40* (2013.01); *H01R 13/516* (2013.01); *H05K 5/0069* (2013.01); *H01R 13/14* (2013.01)

(58) Field of Classification Search
CPC ...... H01R 12/00; H01R 12/75; H01R 12/716; H01R 12/721; H01R 12/73; H01R 24/54; H01R 25/00

USPC .............................. 439/59, 60, 636, 637, 638
See application file for complete search history.

(56) References Cited

U.S. PATENT DOCUMENTS

| | | | |
|---|---|---|---|
| 6,012,551 A * | 1/2000 | Raab | ....................... F16N 11/08 |
| | | | 184/7.4 |
| 6,428,330 B1 * | 8/2002 | Poulter | ............... H04L 12/4604 |
| | | | 439/607.23 |

(Continued)

FOREIGN PATENT DOCUMENTS

| | | |
|---|---|---|
| CN | 101697516 A | 4/2010 |
| CN | 103247902 A | 8/2013 |

(Continued)

OTHER PUBLICATIONS

European search report dated Oct. 27, 2017 for corresponding application No. 17185994.5.

*Primary Examiner* — Hien D Vu
(74) *Attorney, Agent, or Firm* — Nath, Goldberg & Meyer; Jerald L. Meyer

(57) ABSTRACT

In order to enable a simple and secure handling on a wiring of a safety switching apparatus, a safety switching apparatus for the secure switching on and/or off of at least one electrical machine is made available that comprises at least one conductor plate having at least one control unit for controlling the electrical machine and having electrical contacts and a plug connector that can be plugged onto the conductor plate for electrically connecting to the contacts, wherein the plug connector is provided with first connector sockets for the connection of at least one signal encoder and with second connector sockets for the connection of the electrical machine.

12 Claims, 4 Drawing Sheets

Figure 1:
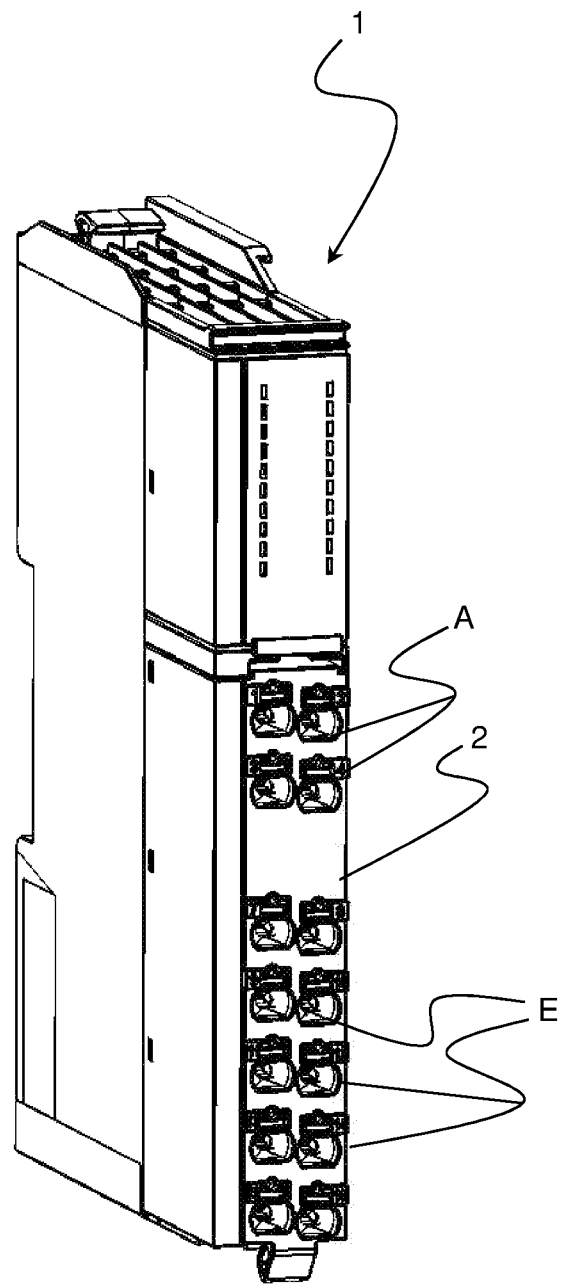

(51) Int. Cl.
*H05K 5/00* (2006.01)
*H01R 13/14* (2006.01)

(56) References Cited

U.S. PATENT DOCUMENTS

| | | | | |
|---|---|---|---|---|
| 7,207,846 B2 * | 4/2007 | Caveney | ................ | H01R 29/00 |
| | | | | 439/676 |
| 7,519,000 B2 * | 4/2009 | Caveney | ................ | H04L 12/10 |
| | | | | 370/242 |
| 9,136,652 B2 * | 9/2015 | Ngo | ....... | H01R 24/00 |
| 2003/0224654 A1 * | 12/2003 | Wu | .................... | H01R 12/7047 |
| | | | | 439/573 |
| 2008/0305682 A1 * | 12/2008 | Wu | ...................... | H01R 12/592 |
| | | | | 439/604 |
| 2011/0300760 A1 * | 12/2011 | Ngo | .................. | H01R 12/7011 |
| | | | | 439/636 |
| 2013/0203296 A1 | 8/2013 | Ngo | | |

FOREIGN PATENT DOCUMENTS

| | | |
|---|---|---|
| DE | 102011110184 A1 | 2/2013 |
| DE | 202016103410 U1 | 9/2016 |

* cited by examiner

SAFETY SWITCHING APPARATUS FOR THE SECURE SWITCHING OFF AND/OR ON OF AT LEAST ONE ELECTRICAL MACHINE

The invention relates to a safety switching apparatus for the secure switching off and/or on of at least one electrical machine.

In today's automation industry electrical machines, such as, for example punches or robots, are connected to safety switching apparatus in a plant. The safety switching apparatus securely switch the electrical machines on and/or off in the plant in such a way that a danger emanating from the electrical machines is minimized or can even be avoided. Such a safety switching apparatus is, for example represented by a safety control or a safety switching relay.

DE 10 2011 110 184 A1 discloses a modular safety control that is composed of a plurality of modules, wherein the modules are connected to one another via a bus system. The safety control has a conductor plate with at least one control unit in the form of a microcontroller for controlling the electrical machine, wherein the conductor plate comprises electrical contacts to which a plug connector can be plugged for the electrical connection with the contacts.

At least one signal encoder or the electrical machine can be connected to the plug connector. The plug connector connected to the signal encoder is provided at an input module and the plug connector connected to the electrical machine is provided at an output module, as the plug connector can be loaded with different voltage strengths. This means in particular that the plug connectors connected to the electrical machine are partly connected to dangerously high voltages in such a way that the plug connectors are spatially separated from one another.

In other words different modules with respective conductor plates and different plug connectors are used for the safety controls of the state of the art in order to connect the signal encoders and the electrical machine to the safety control. This leads to additional cost for the components and an increase in demand in effort and cost on the wiring of the safety control. In particular a plurality of plug connectors have to be separated during maintenance. In order to prevent confusion between the plug connectors, the plug connectors have additionally got to be designed differently or to be coded.

For this reason it is an object of the invention to make available a safety switching apparatus for the secure switching off and/or on of at least one electrical machine of the initially named kind by means of which a simple and secure handling on a wiring is ensured.

This object is satisfied in accordance with the invention by way of a safety switching apparatus for the secure switching off and/or on of at least one electrical machine having the features of the claim 1.

In other words a safety switching apparatus for the secure switching off and/or on of at least one electrical machine is provided that comprises at least one conductor plate having at least one control unit for the control of the electrical machine and having electrical contacts and that comprises a plug connector that can be plugged onto the conductor plate for the electrical connection to the contacts, wherein the plug connector is provided with first connector sockets for the connection of at least one signal encoder and is provided with second connector sockets for the connection of the electrical machine, wherein the electrical contacts of the conductor plate are partly assigned to a low voltage circuit, in particular of 12 volts or 24 volts and partly to a power supply circuit, in particular of 110 or 230 volts, and the plug connector makes available an electrical connection between the electrical contacts of the conductor plate and the first and second connector sockets in such a way that each of the first connector sockets that is connected to the contacts of the low voltage circuit is arranged in a spaced apart manner within the plug connector at a minimum spacing from each second connector socket that is connected to the contacts of the power supply circuit, wherein the minimum spacing is a multiple times larger than a first spacing between respective adjacent first connector sockets or between respective adjacent second connector sockets.

In accordance with a preferred embodiment, the minimum spacing in particular amounts to more than or equal to 5.0 millimeters and the first spacing is less than or equal to 3.2 millimeters. From this the advantage results that the two different voltage circuits are securely insulated with respect to one another, wherein the plug connector can be designed and produced in a very simple manner.

In accordance with a preferred embodiment the safety switching apparatus comprises a safety control or a safety switching relay that can respectively be provided with such a plug connector.

Furthermore, in accordance with a further preferred embodiment, the first connector sockets form input sockets to which the signal encoder can be connected. Additionally the second connector sockets advantageously form output sockets to which the electrical machine can be connected. Hereby the connections of the different voltage circuit can be clearly differentiated from one another and in the event of a maintenance merely one plug connector has to be removed in order to separate the signal encoder and the electrical machine from the conductor plate in such a way that a confusion between the electrical connections is minimized respectfully avoided.

Advantageously the plug connector is filled with an electrically non-conducting material in a region of the minimum spacing between the first connector sockets and the second connector sockets. Preferably the electrically non-conducting material comprises plastic or air in such a way that the insulation can be produced in a simple manner within the plug connector.

In accordance with a further preferred embodiment the connector sockets of the plug connector comprise spring loaded sockets in such a way that a connection between the signal encoder and the electrical machine and the first and second connector sockets of the plug connector can be produced in a very simple manner.

In accordance with a further preferred embodiment a housing of the safety switching apparatus comprises at least one locking mechanism and the plug connector has at least one elastic snap element shape matching in design with respect to the locking mechanism. Additionally the locking mechanism of the housing preferably comprises a step or a recess and the snap element of the plug connector together with the locking mechanism forms a snap connection, in particular a clip closure. From this the advantage results that the plug connector can be inserted into the safety switching apparatus and can be removed again from the same without the use of tools.

Preferred designs and further developments as well as further advantages of the invention can be taken from the dependent claims, the following description and the drawings.

The invention will be described in the following also with respect to further advantages and features with reference to the submitted drawing by means of embodiments.

The figures of the drawing show in.

Figure 2:
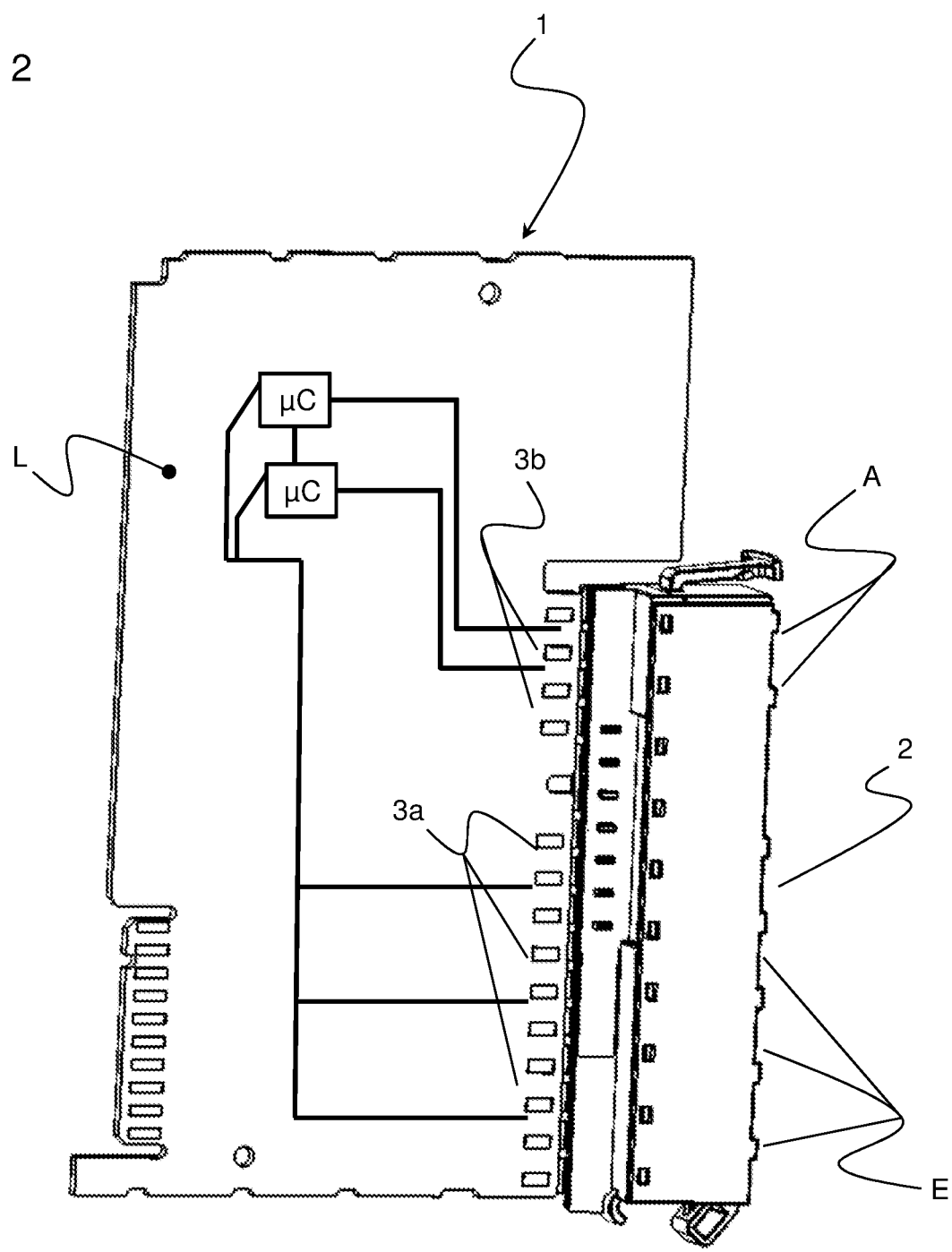
Figure 3:
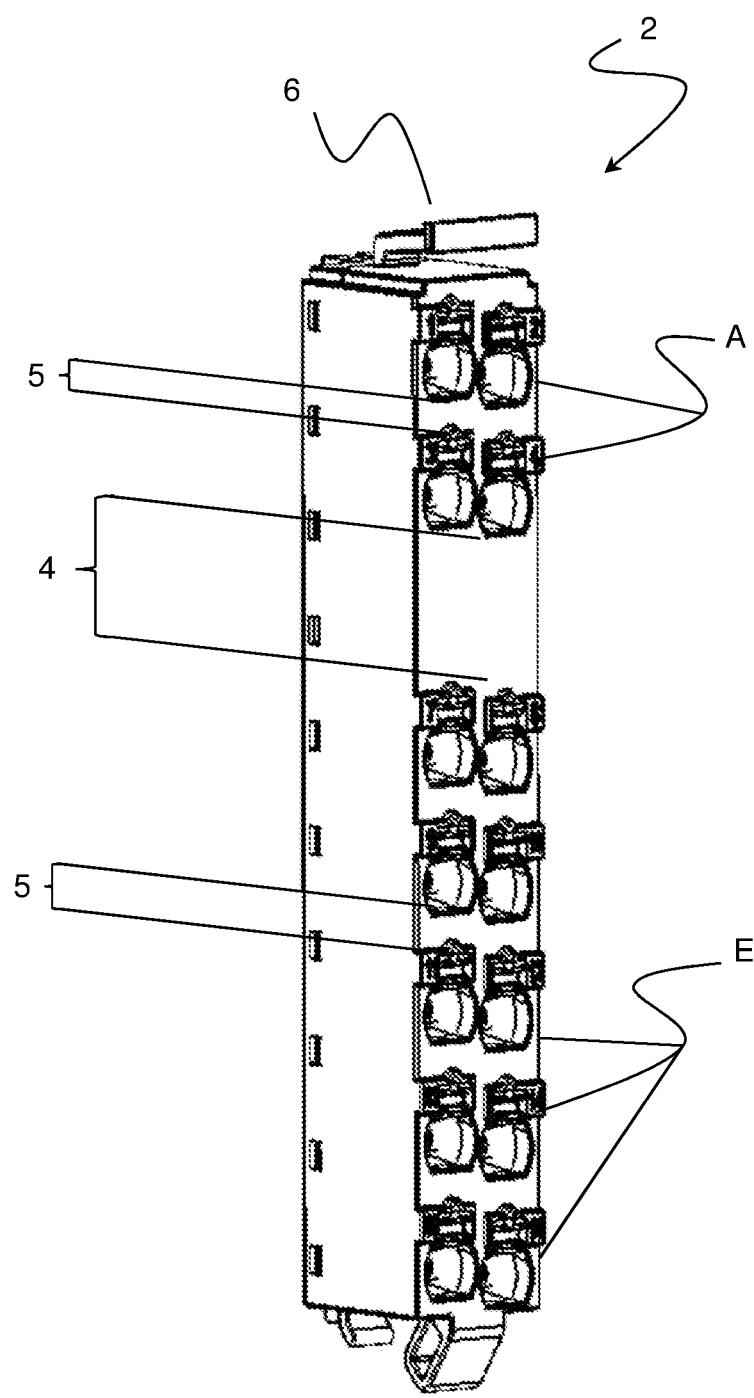

FIG. 1 a schematic perspective illustration of a preferred embodiment of a safety switching apparatus in accordance with the invention;

FIG. 2 a schematic partial illustration of the preferred embodiment;

FIG. 3 a schematic perspective illustration of a plug connector; and

Figure 4:
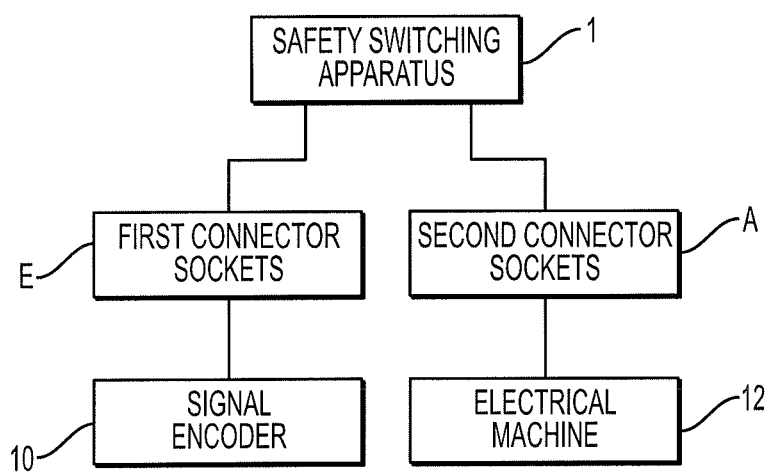

FIG. 4 is a block diagram illustrating connection of the safety switching apparatus to at least one signal encoder and an electrical machine.

The FIG. 1 shows a schematic perspective illustration of a preferred embodiment of a safety switching apparatus 1 in accordance with the invention. In this connection the embodiment shown represents a modular element of a safety control.

The safety switching apparatus 1 serves for the secure switching off and/or on of at least one electrical machine 12, as shown in FIG. 4, wherein a plug connector 2 is provided in the safety switching apparatus 1. The plug connector 2 has first and second connector sockets E, A to which at least one signal encoder 10 and the electrical machine 12 can be connected. Hereby, the first connector sockets E form input sockets in such a way that input signals of the signal encoder 10 can be communicated to the safety control apparatus 1 via the input sockets. The second connector sockets A form output sockets in such a way that a command signal can be transmitted to the electrical machine 12 via the output sockets, with the command signal serving for a secure switching on and/or off of the electrical machine 12.

In the illustrated embodiment the plug connector 2 comprises four second connector sockets A and ten first connector sockets E, with the number of the second and first connector sockets A, E being able to vary differently in dependence on the case of application of the plug connector 2.

From the schematic partial illustration of the safety control apparatus 1 in the FIG. 2 it can be seen that the safety switching apparatus 1 comprises at least one conductor plate L, wherein the conductor plate L has at least one control unit μC that serves for the reception and processing of the input signals of the non-illustrated signal encoder. The control unit μC additionally controls the electrical machine. In this connection the control unit μC can be configured in the form of a microcontroller.

The conductor plate L furthermore has electrical contacts 3a, 3b that can be plugged onto the plug connector 2, whereby an electrical connection can be produced between the contacts 3a, 3b and the first and second connector sockets E, A of the plug connector 2.

A part of the set of electrical contacts 3a of the conductor plate L is assigned to a low voltage circuit that makes available a low voltage. This means that a potential of, for example 12 volts or 24 volts, is present at the electrical contacts 3a that is sufficient for the signal encoders connectable to the electrical contacts 3a. The other part of the set of the electrical contacts 3b of the conductor plate L is assigned to a power supply circuit that makes available a potential of, for example 110 volts or a 230 volts. The electrical machine can be controlled via the contacts 3b assigned to the power supply circuit.

The first and second connector sockets E, A of the plug connector 2 are electrically connected to the contacts 3a assigned to the low voltage circuit by plugging the plug connector 2 onto the conductor plate L and to the contacts 3b assigned to the power supply circuit, wherein the plug connector 2 makes available an electrical connection in accordance with the invention between the electrical contacts 3a, 3b and the first and second connector socket E, A in such a way that each first connector socket E that is connected to the contacts of the low voltage circuit is arranged in a spaced apart manner at a minimum spacing within the plug connector 2 from each of the second connector sockets A that is connected to the contacts of the power supply circuit, as illustrated in FIG. 3. Hereby the minimum spacing 4 is a multiple times larger than a first spacing 5 between respectively adjacent first connector sockets E or between respectively adjacent second connector sockets A.

In other words this means that a first connector socket E is always arranged spaced apart a multiple times further from a second connector socket A than from an adjacent first connector socket E within the plug connector 2. Vice versa a second connector socket A is always arranged spaced apart a multiple times further from a first connector socket E than from an adjacent second connector socket A within the plug connector 2.

Preferably the minimum spacing 4 is larger than or equal to 5.0 millimeters and the first spacing 5 is smaller than or equal to 3.2 millimeters. This means that the first connector sockets E of the plug connector 2 are arranged at a minimum spacing 4 of 5.5 millimeters from the second connector sockets A of the plug connector 2 in the illustrated and preferred embodiment, wherein the first spacing 5 between the first connector sockets E and/or between the second connector sockets A of the plug connector merely amounts to 1.0 millimeter between two adjacent connector sockets E and/or 3.2 millimeters between two adjacent connector sockets A. Hereby the first spacing 5 can preferably also amount to 3.2 millimeters between two adjacent connector sockets E and/or A in such a way that the plug connector 2 can be designed and manufactured symmetrically.

As soon as the plug connector 2 is thus inserted into the safety switching apparatus 1, the connector sockets E, A of the plug connector 2 are electrically connected to the contacts 3a, 3b of the conductor plate L, wherein the connector sockets E loaded with the low voltage via the contacts 3a are electrically separated and/or insulated from the connector sockets A loaded with the power supply voltage via the contacts 3b. Hereby it is ensured that the contacts 3a, 3b of the low voltage circuit and of the power supply circuit are electrically securely separated from one another within the plug connector 2.

For this purpose the plug connector 2 is filled with electrically non-conducting material in a region of the minimum spacing 4 between the first connector sockets E and the second connector sockets A. Preferably the electrically non conducting material comprises plastic or air in such a way that, on the manufacture of the plug connector 2 by means of, for example, an injection molding process, electrically non conducting material can be provided in a very simple manner in the plug connector 2.

The FIG. 3 shows a schematic perspective illustration of the plug connector 2 from which one can clearly see that the first and second connector sockets E, A of the plug connector 2 are arranged at the minimum spacing 4 with respect to one another. Hereby the electrical separation between the first connector sockets E having the low voltage and the second connector sockets A having the high voltage is securely ensured within the plug connector 2. Preferably the first and second connector sockets E, A are formed as spring loaded sockets. Hereby a very simple wiring of the safety switching apparatus 1 is ensured.

The plug connector 2 has an additional elastic snap element 6 that is configured in a shape matching manner to a non-illustrated locking mechanism present at a housing of the safety switching apparatus 1. The locking mechanism comprises a step or a recess with which the elastic snap element 6 of the plug connector 2 forms a snap connection, in particular a clip closure.

Hereby the plug connector 2 can be introduced into the safety switching apparatus and/or be removed from the safety switching apparatus without the use of tools, with merely the snap elements 6 of the plug connector 2 having to be actuated.

LIST OR REFERENCE NUMERALS

1 safety switching apparatus
2 plug connector
3*a*, 3*b* electrical contacts
4 minimum spacing
5 first spacing
6 snap element
A, E connector sockets
L conductor plate
C control unit

What is claimed is:

1. A safety switching apparatus for the secure switching off and/or on of at least one electrical machine, the safety switching apparatus comprising:
   at least one printed circuit board having at least one control unit for the control of the at least one electrical machine and having first and second electrical contacts, wherein the at least one control unit receives and processes input signals from at least one signal encoder via the first and second electrical contacts; and
   a plug connector that can plugged onto the at least one printed circuit board for electrical connection to the first and second electrical contacts,
   wherein the plug connector is provided with first connector sockets configured to be connected to the at least one signal encoder and with second connector sockets configured to be connected to the at least one electrical machine,
   wherein the first and second electrical contacts of the at least one printed circuit board are partly assigned to a low voltage circuit and partly assigned to a power supply circuit, wherein the low voltage circuit operates at a lower voltage than a voltage of the power supply circuit, and the plug connector makes available an electrical connection between the first and second electrical contacts of the at least one printed circuit board and the first and second connector sockets in such a way that each first connector socket that is connected to the first electrical contacts of the low voltage circuit is arranged in a spaced apart manner within the plug connector at a minimum spacing from each of the second connector sockets that are connected to the second electrical contacts of the power supply circuit,
   wherein the minimum spacing is larger than a first spacing between respectively adjacent ones of the first connector sockets or between respectively adjacent ones of the second connector sockets.

2. The safety switching apparatus in accordance with claim 1, wherein the low voltage circuit is operated at one of 12 volt and 24 volt.

3. The safety switching apparatus in accordance with claim 1, wherein the power supply circuit is operated at one of 110 volt and 230 volt.

4. The safety switching apparatus in accordance with claim 1, wherein the safety switching apparatus comprises a safety control or a safety switching relay.

5. The safety switching apparatus in accordance with claim 1, wherein the minimum spacing is larger than or equal to 5.0 millimeters and the first spacing is less than or equal to 3.2 millimeters.

6. The safety switching apparatus in accordance with claim 1, wherein the first connector sockets form input sockets to which the at least one signal encoder can be connected and the second connector sockets form output sockets to which the at least one electrical machine can be connected.

7. The safety switching apparatus in accordance with claim 1, wherein the plug connector is filled with an electrically non-conducting material in a region of the minimum spacing between the first connector sockets and the second connector sockets.

8. The safety switching apparatus in accordance with claim 7, wherein the electrically non-conducting material comprises one of plastic and air.

9. The safety switching apparatus in accordance with claim 1, wherein the first and second connector sockets of the plug connector comprise spring loaded sockets.

10. The safety switching apparatus in accordance with claim 1, wherein a housing of the safety switching apparatus has at least one locking mechanism and the plug connector has at least one elastic snap element shape matching the locking mechanism.

11. The safety switching apparatus in accordance with claim 10, wherein the locking mechanism of the housing comprises a step or a recess and the snap element of the plug connector forms a snap connection with the locking mechanism.

12. The safety switching apparatus in accordance with claim 11, wherein the snap connection is a clip closure.

* * * * *